United States Patent
Angerstein et al.

[19]

[11] Patent Number: 6,157,476
[45] Date of Patent: Dec. 5, 2000

[54] TRANSCEIVER COMPONENT FOR DATA TRANSMISSION

[75] Inventors: Jörg Angerstein, Flein; Werner Schairer, Weinsberg; Ulrich Wicke, Heilbronn, all of Germany

[73] Assignee: Temic Telefunken Microelectronic GmbH, Heilbronn, Germany

[21] Appl. No.: 08/995,536

[22] Filed: Dec. 22, 1997

[30] Foreign Application Priority Data

Dec. 21, 1996 [DE] Germany ............................ 196 53 793

[51] Int. Cl.⁷ .................................................. H04B 10/00
[52] U.S. Cl. ........................................... 359/152; 359/163
[58] Field of Search .................................... 359/152, 163, 359/113, 143; 385/14

[56] References Cited

U.S. PATENT DOCUMENTS

| | | | |
|---|---|---|---|
| 5,122,893 | 6/1992 | Tolbert | 359/152 |
| 5,432,630 | 7/1995 | Lebby et al. | 359/152 |
| 5,493,437 | 2/1996 | Lebby et al. | 359/152 |

FOREIGN PATENT DOCUMENTS

| | | |
|---|---|---|
| 3241942 | 3/1985 | Germany . |
| 9212176 U | 3/1993 | Germany . |
| 19508284 | 1/1996 | Germany . |
| 19512206 | 1/1996 | Germany . |

*Primary Examiner*—Kinfe-Michael Negash
*Attorney, Agent, or Firm*—Venable; Norman N. Kunitz; Leo J. Jennings

[57] ABSTRACT

In a transceiver component for optical data transmission a transmitter, a receiver and at least one integrated circuit are arranged in a single housing. The housing has a number of terminals. One terminal of the transceiver component is provided solely for feeding the driver current to the transmitter. Consequently, it is possible to connect the transmitter with its high current consumption directly with the non-stabilized power supply such as, for instance, the mains adapter, the rechargeable battery pack or the batteries. The stabilized power supply can then be dimensioned correspondingly smaller and be produced at lower cost.

6 Claims, 2 Drawing Sheets

TRANSCEIVER COMPONENT FOR DATA TRANSMISSION

BACKGROUND OF THE INVENTION

The invention relates to a transceiver component for optical data transmission with a transmitter, a receiver and at least one integrated circuit, all of which are arranged in a single housing that has electrical terminals.

Transceiver components for data transmission systems containing an infrared transmitter, an infrared receiver and an integrated circuit in a single housing are offered by the company TEMIC TELEFUNKEN microelectronic with the designation TFDS 3000. The housing also includes optical systems in order to provide directed data transmission complying with the IrDA standard.

A disadvantage with the known infrared transceiver components, however, is that the power supply to the transmitter and the other components, i.e. the infrared receiver and the integrated circuit, is via a common terminal. The transmitter consumes a relatively large amount of current compared with the other components and this can have a peak value of up to 500 mA. The current consumption of the infrared receiver and the integrated circuit, however, is only in the region of 1.5 mA. If an infrared transceiver component of this type is incorporated in a circuit arrangement, it must be borne in mind when dimensioning the power supply that the transceiver will account for a current consumption of more than 500 mA. It is however an elaborate and costly procedure to provide this high current from a stabilized power supply.

SUMMARY OF THE INVENTION

The object of the invention is therefore to specify a transceiver component for optical data transmission of the kind described above that draws only a low current from a stabilized power supply.

This object is solved by the invention, which pertains to a transceiver component for optical data transmission having a transmitter, a receiver and at least one integrated circuit arranged in a single housing. The housing has a number of electrical terminals. One terminal of the transceiver component is provided solely for the purpose of supplying driver current to the transmitter. It is therefore possible to connect the transmitter with its high current consumption directly to the non-stabilized power supply such as, for instance, the mains adapter, the rechargeable battery pack or the batteries. The stabilized power supply can then be dimensioned correspondingly smaller and be produced at lower cost.

Another terminal is provided for feeding the supply voltage to the receiver and the integrated circuit. This terminal is connected either directly to the stabilized power supply or it is controlled from another part of a circuit arrangement. Generally speaking, the current consumption of 1.5 mA has no substantial effect on the stabilized power supply. If the power supply to this terminal is switched off, no current flows to the transmitter driven by the integrated circuit.

Another terminal is provided for the supply of a common reference potential.

Another terminal is provided for the supply of transmission data and for outputting received data.

The terminals are formed in such a way that the transceiver component is suitable for surface mounting. When applying the surface mounting method, the alignment can be perpendicular or parallel to the mounting plane.

DESCRIPTION OF THE PREFERRED EMBODIMENTS

Exemplary embodiments of the transceiver component for optical data transmission in accordance with the invention will now be described with reference to the Figures.

Figure 1:
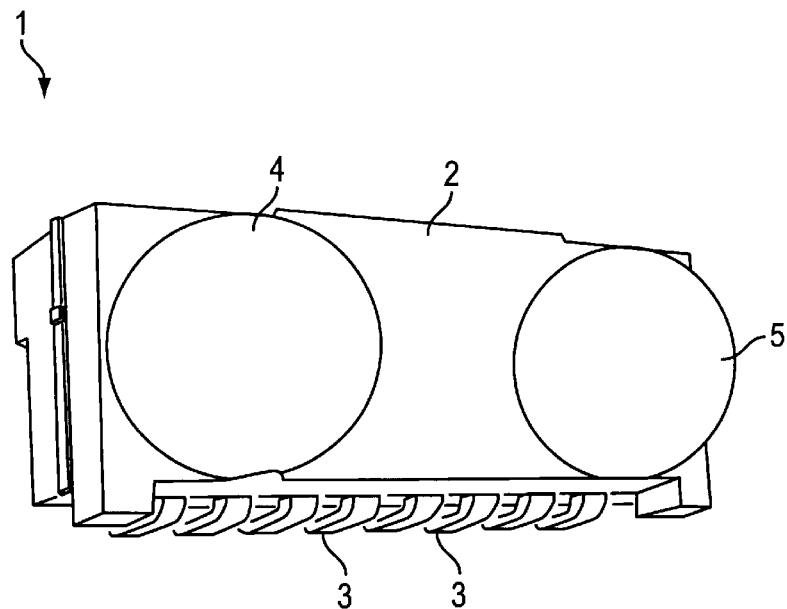
FIG. 1 shows a transceiver component for optical data transmission as a perspective drawing.

FIG. 1 shows a transceiver component 1 for optical data transmission as a perspective drawing. It consists of a housing 2 that is transparent for radiation in the infrared light spectrum and having a number of electrical terminals 3. The housing 2 encompasses a transmitter and a receiver for infrared light and an integrated circuit. The surface of the housing is designed above the transmitter and the receiver in such a way that the incoming and outgoing radiation is optically focused. In the embodiment example, there are two lens bodies 4, 5 which protrude from the housing. One of the terminals 3 has the sole purpose of feeding the supply voltage to the transmitter. The supply voltage for the integrated circuit and the receiver is obtained from another terminal. Consequently, it is possible to connect the transmitter with its high current consumption directly with the non-stabilized power supply such as, for instance, the mains adapter, the rechargeable battery pack or the batteries. The integrated circuit and the receiver are connected either directly to the stabilized power supply or they are supplied with voltage from another part of a circuit arrangement. The current consumption of 1.5 mA does not generally impose a load on the stabilized power supply or on the other part of the circuit arrangement.

Figure 2:
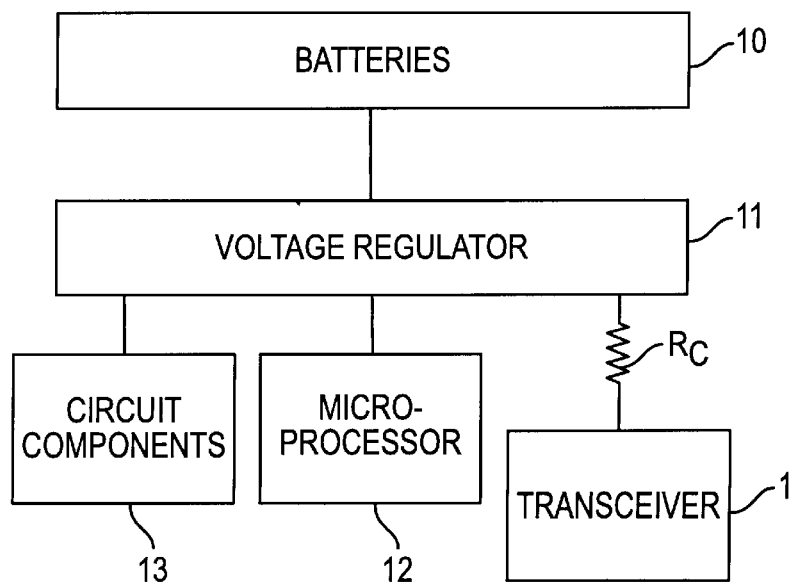
FIG. 2 shows a circuit arrangement with a transceiver component for optical data transmission according to the state of the art.

In order to better illustrate this advantage, a circuit arrangement is shown in FIG. 2 that is provided with a state-of-the-art transceiver component for the purpose of optical data transmission. A pack of batteries 10, rechargeable or otherwise, supplies an output voltage that is initially non-stabilized. This is then stabilized by a voltage regulator 11.

The voltage regulator 11 supplies not only the transceiver component 1 but also a microprocessor 12 and other circuit components 13 with a regulated, stabilized power supply. An element for current limitation $R_C$ is placed in the supply line of the transceiver component 1. The disadvantages explained at the outset apply to this circuit arrangement. In particular, the voltage regulator 11 must be dimensioned such that even the high current consumption of the transmitter does not result in a disadvantageous situation.

With the transceiver component in accordance with the invention, it is possible for the voltage regulator of a circuit arrangement of this kind to be made considerably smaller and at lower cost.

Figure 3:
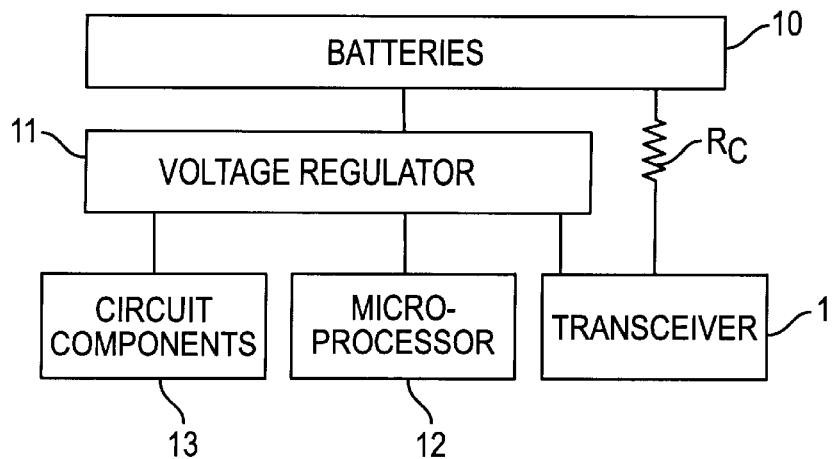
FIG. 3 shows a first circuit arrangement with a transceiver component for optical data transmission according to the invention.

The circuit arrangement of FIG. 3 for optical data transmission has a pack of rechargeable or non-rechargeable batteries or a mains adapter 10 connected with voltage regulator 11 and via a current-limiting element $R_C$ to the transmitter of the transceiver component. The voltage regulator 11 need not in this case be designed for the high current consumptions that occur at peak operating times of the transmitter. The transmitter draws the required current from the non-stabilized voltage of the rechargeable or non-rechargeable batteries or the mains adapter 10. The integrated circuit and the receiver are connected to the voltage regulator via an additional power supply terminal.

Figure 4:
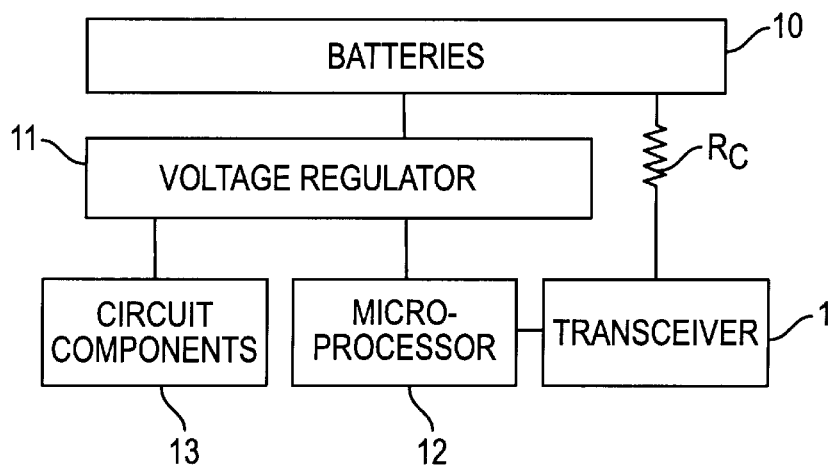
FIG. 4 shows a second circuit arrangement with a transceiver component for optical data transmission according to the invention.

In the circuit arrangement shown in FIG. 4, the integrated circuit and the receiver are driven directly by and supplied with current from the processor 12. Because the supply voltage of the transmitter is controlled by the integrated circuit from an open collector driver, it is also possible to switch off the transmitter on switching off the power supply of the integrated circuit.

Figure 5:
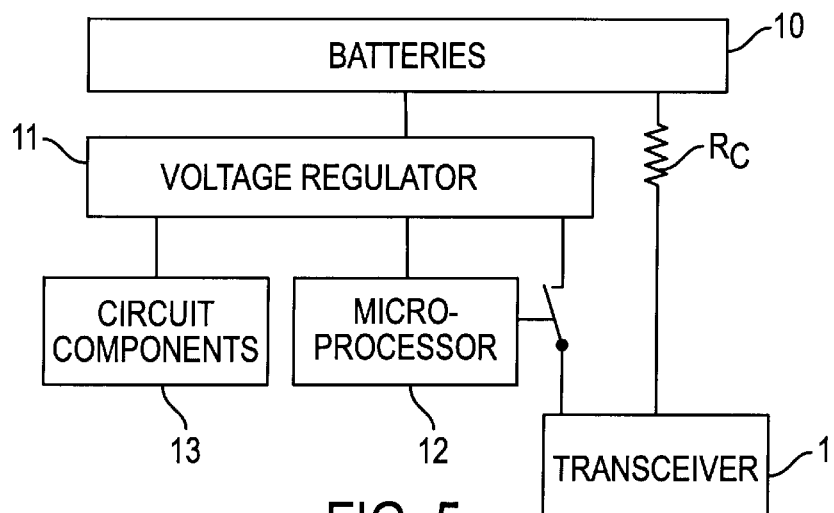
FIG. 5 shows a third circuit arrangement with a transceiver component for optical data transmission according to the invention.

In the circuit arrangement shown in FIG. 5, the integrated circuit and the receiver are driven indirectly by the processor 12. There is a switch $T_1$ in the supply line and it is driven directly by the processor 12. This arrangement is useful in particular when the approx. 1.5 mA for supplying the integrated circuit and the receiver cannot be provided at the output of the processor.

For better clarification, FIGS. 2 to 5 show only those supply lines that are necessary to understand the description. The common ground potential is not shown, neither are the other functional connections of the circuit blocks among themselves.

The particular features of the transceiver component in accordance with the invention are that it is undemanding with respect to the supply voltage, 1.5 mA stabilized and 500 mA non-stabilized, and by its rapid switch-off characteristic of the transmitter on switching off the supply voltage of the integrated circuit (shutdown).

What is claimed is:

1. A transceiver component for optical data transmission, comprising:

an optical transmitter;

an optical receiver;

at least one integrated circuit;

a housing that houses the transmitter, the receiver and the at least one integrated circuit arranged therein and having electrical terminals, including a driver current terminal solely for supplying driver current to the transmitter;

a transmission data supply terminal for supplying transmission data to the transmitter; and a received data output terminal for outputting received data from the receiver.

2. A transceiver component in accordance with claim 1, further comprising a supply voltage terminal for feeding a supply voltage to the receiver and the integrated circuit.

3. A transceiver component in accordance with claim 1, further comprising a reference potential terminal for supplying a common reference potential.

4. A transceiver component in accordance with claim 1, wherein the terminals are formed to permit surface mounting of the transceiver component.

5. A transceiver in accordance with claim 1, further comprising means for surface mounting the transceiver component to a surface have a mounting plane, so that the transceiver component is aligned perpendicular to the mounting plane.

6. A transceiver component in accordance with claim 1, further comprising means for a surface mounting the transceiver component to a surface having a mounting plane, so that the transceiver component is aligned parallel to the mounting plane.

* * * * *